United States Patent
Nomaru et al.

(10) Patent No.: US 11,137,358 B2
(45) Date of Patent: Oct. 5, 2021

(54) TESTING SYSTEM

(71) Applicant: DISCO CORPORATION, Tokyo (JP)

(72) Inventors: Keiji Nomaru, Tokyo (JP); Taiki Sawabe, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/748,258

(22) Filed: Jan. 21, 2020

(65) Prior Publication Data

US 2020/0240930 A1 Jul. 30, 2020

(30) Foreign Application Priority Data

Jan. 25, 2019 (JP) .............................. JP2019-011220

(51) Int. Cl.
| | | |
|---|---|---|
| *G01R 27/04* | (2006.01) | |
| *G01R 27/32* | (2006.01) | |
| *G01N 22/00* | (2006.01) | |
| *G01N 22/02* | (2006.01) | |
| *G01N 22/04* | (2006.01) | |
| *G01N 21/3581* | (2014.01) | |
| *G01F 23/284* | (2006.01) | |
| *G01F 1/66* | (2006.01) | |
| *G01F 23/00* | (2006.01) | |

(52) U.S. Cl.
CPC ............. *G01N 22/00* (2013.01); *G01F 1/667* (2013.01); *G01F 23/284* (2013.01); *G01N 21/3581* (2013.01); *G01N 22/02* (2013.01); *G01N 22/04* (2013.01); *G01F 23/0023* (2013.01); *G01F 23/0069* (2013.01)

(58) Field of Classification Search
CPC ........ G01N 22/00; G01N 22/02; G01N 22/04; G01N 21/3581; G01F 23/284; G01F 1/667; G01F 23/0023; G01F 23/0069; H01L 22/12
USPC ... 324/76.11–76.83, 459, 600, 629, 637, 642
See application file for complete search history.

(56) References Cited

U.S. PATENT DOCUMENTS

| | | | | |
|---|---|---|---|---|
| 2008/0180697 A1* | 7/2008 | Sawabe | .............. | G01B 11/0625 356/630 |
| 2010/0044359 A1* | 2/2010 | Sawabe | .................. | B23K 26/03 219/121.83 |
| 2011/0266266 A1* | 11/2011 | Kondo | ................. | B23K 26/082 219/121.72 |

(Continued)

FOREIGN PATENT DOCUMENTS

| JP | 2005142359 A | 6/2005 |
|---|---|---|
| JP | 2005317846 A | 11/2005 |

*Primary Examiner* — Raul J Rios Russo
(74) *Attorney, Agent, or Firm* — Greer, Burns & Crain, Ltd.

(57) ABSTRACT

A testing system for testing a workpiece for a characteristic by irradiating microwaves to the workpiece and also irradiating a laser beam at an irradiation position of the microwaves, receiving microwaves reflected at the irradiation position where the workpiece has a reflectivity increased by carriers generated through photoexcitation, and measuring a lifetime of the carriers. The testing system includes a chuck table that holds the workpiece, a microwave irradiation unit that irradiates the microwaves to the workpiece held on the chuck table, a microwave reception unit that receives microwaves reflected by the workpiece, and a laser beam irradiation unit that irradiates the laser beam onto the irradiation position to which the microwaves have been irradiated.

5 Claims, 4 Drawing Sheets

(56) References Cited

U.S. PATENT DOCUMENTS

2016/0172182 A1\* 6/2016 Morikazu ......... H01L 21/67092
425/150
2017/0014947 A1\* 1/2017 Odagiri ................ B23K 26/032
2018/0339362 A1\* 11/2018 Sawabe .................. G01N 21/55

\* cited by examiner

US 11,137,358 B2

TESTING SYSTEM

BACKGROUND OF THE INVENTION

Field of the Invention

The present invention relates to a testing system that tests a workpiece for a characteristic.

Description of the Related Art

A wafer with a plurality of devices such as integrated circuits (ICs) or large-scale integrated circuits (LSIs) formed on a surface thereof, which is divided by a plurality of intersecting division lines, is polished and finished on a back side thereof by a polishing machine to a predetermined thickness, and is then divided into individual device chips by a cutting machine. The divided device chips are used in electronic equipment such as mobile phones and personal computers.

As means for improving the quality of the device chips described above, it is known to polish the back side of the wafer and to allow a resulting strained layer to remain so that the migration of metal ions such as copper ions, which exist inside the wafer, is suppressed to induce a gettering effect (see, for example, JP 2005-317846A).

It is also known to evaluate a semiconductor wafer for a physical characteristic by irradiating microwaves to the semiconductor wafer, as a test target, at a predetermined irradiation position thereof and also irradiating a laser beam onto the irradiation position, receiving microwaves reflected at the irradiation position where the semiconductor wafer has a reflectivity increased corresponding to the density of carriers (photoelectron-hole pairs) generated through photoexcitation, and measuring the time until the reflectivity attenuates and become extinct, in other words, a so-called carrier lifetime (see, for example, JP 2005-142359A).

SUMMARY OF THE INVENTION

According to the technique described in JP 2005-142359A, the physical characteristic of a semiconductor wafer is evaluated based on the length of a carrier lifetime. However, a carrier lifetime is affected by the material of a workpiece, the kind of an impurity (heavy metal or the like) layer contained in the workpiece, and the wavelength of a laser beam irradiated onto the workpiece. To perform an appropriate evaluation as to a physical characteristic based on the length of the carrier lifetime by using microwaves, there is accordingly a need to appropriately select the wavelength of a laser beam, which is to be irradiated, according to the material of the workpiece and the kind of the impurity (heavy metal or the like) layer in the workpiece. Nonetheless, there has heretofore been a problem that a test can hardly be conducted under an appropriate wavelength corresponding to the workpiece.

The present invention therefore has as an object thereof the provision of a testing system that can appropriately test a workpiece by using microwaves.

In accordance with an aspect of the present invention, there is provided a testing system for testing a workpiece for a characteristic. The testing system includes a chuck table that holds the workpiece, microwave irradiation means that irradiates microwaves to the workpiece held on the chuck table, microwave reception means that receives microwaves reflected from the workpiece, and a laser beam irradiation unit that irradiates a laser beam onto the workpiece at an irradiation position thereof where the microwaves have been irradiated. The laser beam irradiation unit includes a wavelength selection section capable of selecting a wavelength for the laser beam to be irradiated. The workpiece is tested for the characteristic by irradiating the microwaves from the microwave irradiation means to the workpiece and also irradiating the laser beam from the laser beam irradiation unit onto the workpiece at the irradiation position, receiving, by the microwave reception means, microwaves reflected at the irradiation position where the workpiece has a reflectivity increased by carriers generated through photoexcitation, and measuring a lifetime of the carriers.

Preferably, the laser beam irradiation unit may include a white light source as a light source and a plurality of kinds of bandpass filters as the wavelength selection section, and the bandpass filters are configured to selectively extract and irradiate light of a plurality of wavelengths out of light from the white light source. Preferably, the white light source may be selected from a group consisting of a super luminescent diode light source, an amplified spontaneous emission light source, a supercontinuum light source, a light emitting diode light source, a halogen light source, a xenon light source, a mercury light source, and a metal halide light source. Preferably, the laser beam irradiation unit may include variable-wavelength laser generation means.

According to the testing system of the present invention, a workpiece can be appropriately tested for a characteristic in line with the material of the workpiece and the kind of an impurity (heavy metal or the like) layer in the workpiece owing to the inclusion of the wavelength selection section capable of selecting a wavelength for the laser beam to be irradiated.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
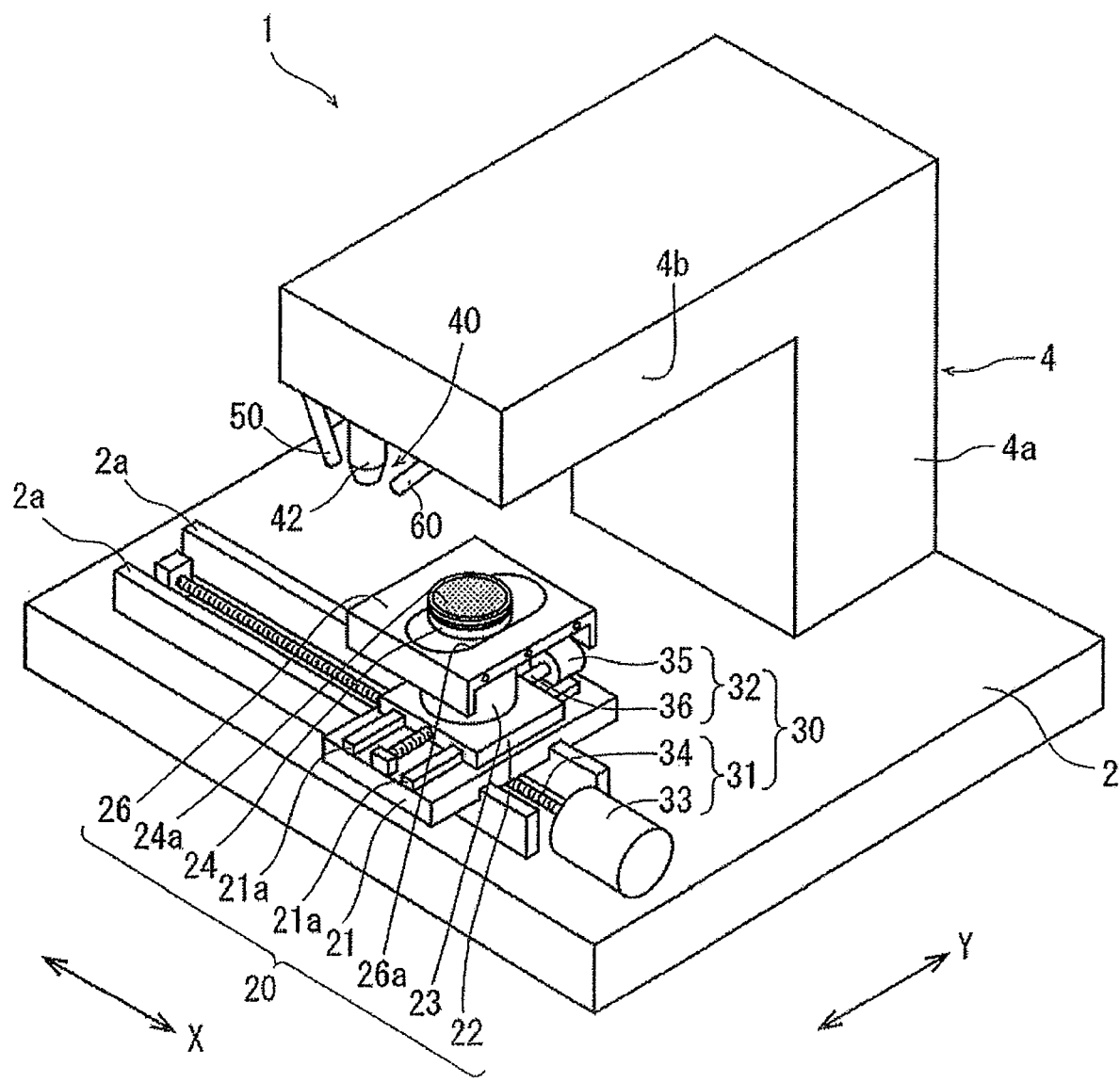
FIG. 1 is an overall perspective view of a testing system according to an embodiment of the present invention.

With reference to the attached drawings, a description will hereinafter be made in detail about a testing system 1 according to an embodiment of the present invention. FIG. 1 depicts a perspective view of the testing system 1, which tests a workpiece for a characteristic by irradiating microwaves to the workpiece and also irradiating a laser beam at an irradiation position of the microwaves, receiving microwaves reflected at the irradiation position where the workpiece has a reflectivity increased by carriers (photoelectron-hole pairs) generated through photoexcitation, and measuring a lifetime of the carriers.

The testing system 1 includes a holding unit 20 that holds the workpiece (for example, a semiconductor wafer 10 depicted in FIG. 2), a moving mechanism 30 that moves the holding unit 20, an optical system 40 that includes a laser beam irradiation unit 41, microwave irradiation means 50, and microwave reception means 60.

The holding unit 20 includes a rectangular X-axis direction movable plate 21, a rectangular Y-axis direction movable plate 22, a cylindrical post 23, and a rectangular cover plate 26. The X-axis direction movable plate 21 is mounted on a stationary base 2 movably in an X-axis direction indicated by arrow X in the figure, and the Y-axis direction movable plate 22 is mounted on the X-axis direction movable plate 21 movably in a Y-axis direction indicated by arrow Y in the figure. The post 23 is fixed on an upper surface of the Y-axis direction movable plate 22, and the cover plate 26 is fixed on an upper end of the post 23. Disposed centrally on the cover plate 26 is a circular chuck table 24, which extends upward through a slot 26a formed in the cover plate 26. The chuck table 24 is configured to hold the semiconductor wafer 10 and to be rotatable by undepicted rotary drive means. Arranged on an upper surface of the chuck table 24 is a circular suction chuck 24a, which is formed from a porous material and extends substantially horizontally. The suction chuck 24a is connected to undepicted suction means via a flow passage that internally extends through the post 23. A plane defined by the X-axis direction and the Y-axis direction is substantially horizontal.

The moving mechanism 30 includes an X-axis direction feed mechanism 31 and a Y-axis direction feed mechanism 32. The X-axis direction feed mechanism 31 is disposed on the stationary base 2, and feeds the holding unit 20 in the X-axis direction, and the Y-axis direction feed mechanism 32 index-feeds the holding unit 20 in the Y-axis direction. Via a ball screw 34, the X-axis direction feed mechanism 31 converts a rotational motion of a pulse motor 33 to a linear motion and transmits the linear motion to the X-axis direction movable plate 21, whereby the X-axis direction movable plate 21 is advanced or retracted in the X-axis direction along guide rails 2a on the stationary base 2. Via a ball screw 36, the Y-axis direction feed mechanism 32 converts a rotational motion of a pulse motor 35 to a linear motion and transmits the linear motion to the Y-axis direction movable plate 22, whereby the Y-axis direction movable plate 22 is advanced or retracted in the Y-axis direction along guide rails 21a on the X-axis direction movable plate 21. Although depiction is omitted in the figure, the X-axis direction feed mechanism 31, the Y-axis direction feed mechanism 32, and the chuck table 24 each include position detection means, so that the positions of the chuck table 24 in the X-axis direction and the Y-axis direction and the angular position of the chuck table 24 in a circumferential direction are accurately detected, and are transmitted to a control unit 100 (see FIG. 3) that will be described subsequently herein. Based on signals instructed from the control unit 100, the X-axis direction feed mechanism 31, the Y-axis direction feed mechanism 32, and the undepicted rotary drive means for the chuck table 24 are driven so that the chuck table 24 can be positioned at a desired coordinate position and rotational angle.

Laterally to the moving mechanism 30, a frame 4 is disposed upright. The frame 4 includes a vertical wall portion 4a disposed on the stationary base 2, and a horizontal wall portion 4b extending in a horizontal direction from an upper end portion of the vertical wall portion 4a. The optical system 40 with the laser beam irradiation unit 41 included therein, the microwave irradiation means 50 and the microwave reception means 60 are incorporated in the horizontal wall portion 4b of the frame 4. A condenser 42, which forms a part of the optical system 40, is disposed on a lower surface of an end portion of the horizontal wall portion 4b, and an unillustrated condenser lens and the like are incorporated inside the condenser 42.

Figure 2:
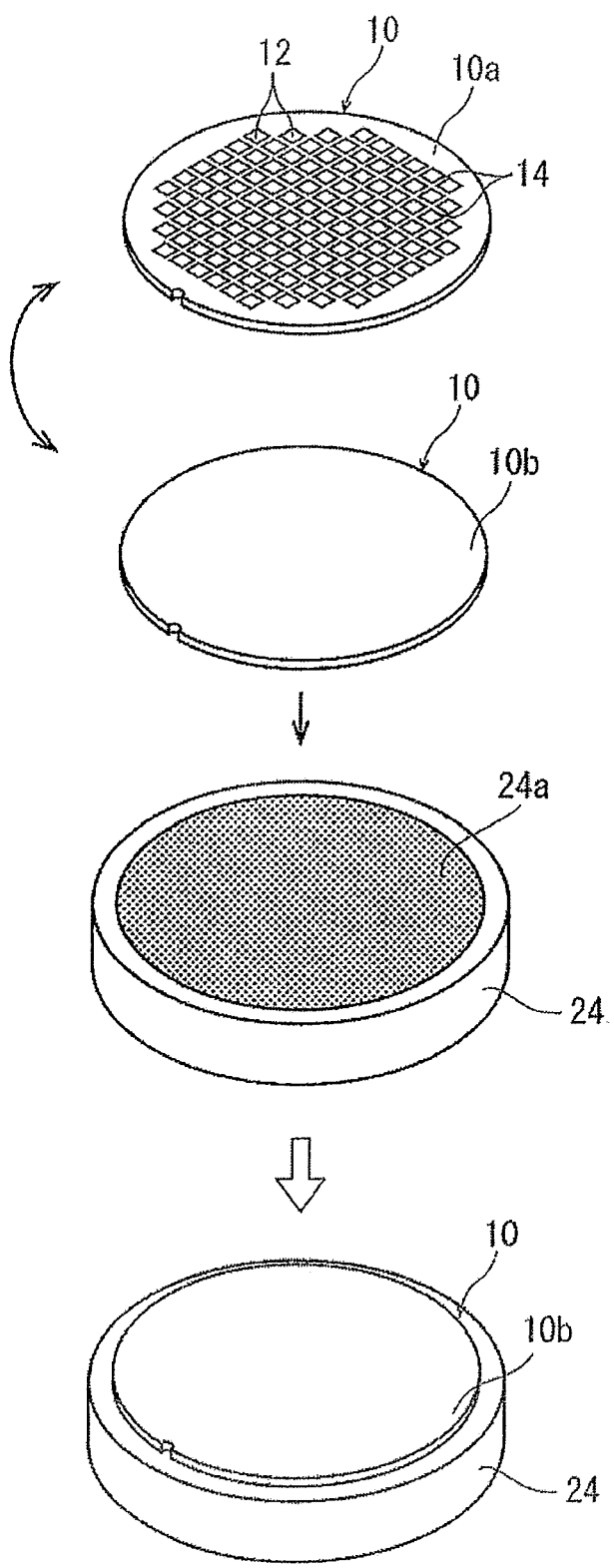
FIG. 2 is a perspective view illustrating how to mount a workpiece on a chuck table in the testing system depicted in FIG. 1.

The workpiece in this embodiment is the semiconductor wafer 10 depicted in FIG. 2. On a side of a front side 10a of the semiconductor wafer 10, devices 12 are formed in individual regions divided by a plurality of division lines 14 formed in a lattice pattern. On a side of a back side 10b, on the other hand, polishing machining has been applied by an undepicted polishing machine, and a strained layer is formed. The strained layer has a thickness of, for example, 0.2 μm or smaller and includes microcracks when seen under a transmission electron microscope, and induces a gettering effect. Upon holding the semiconductor wafer 10 on the chuck table 24, the surface 10a of the semiconductor wafer 10 is mounted on the suction chuck 24a with the side of the back side 10b, on which the strained layer has been formed, directed upward, and the undepicted suction means is then operated to hold the semiconductor wafer 10 under suction.

Figure 3:
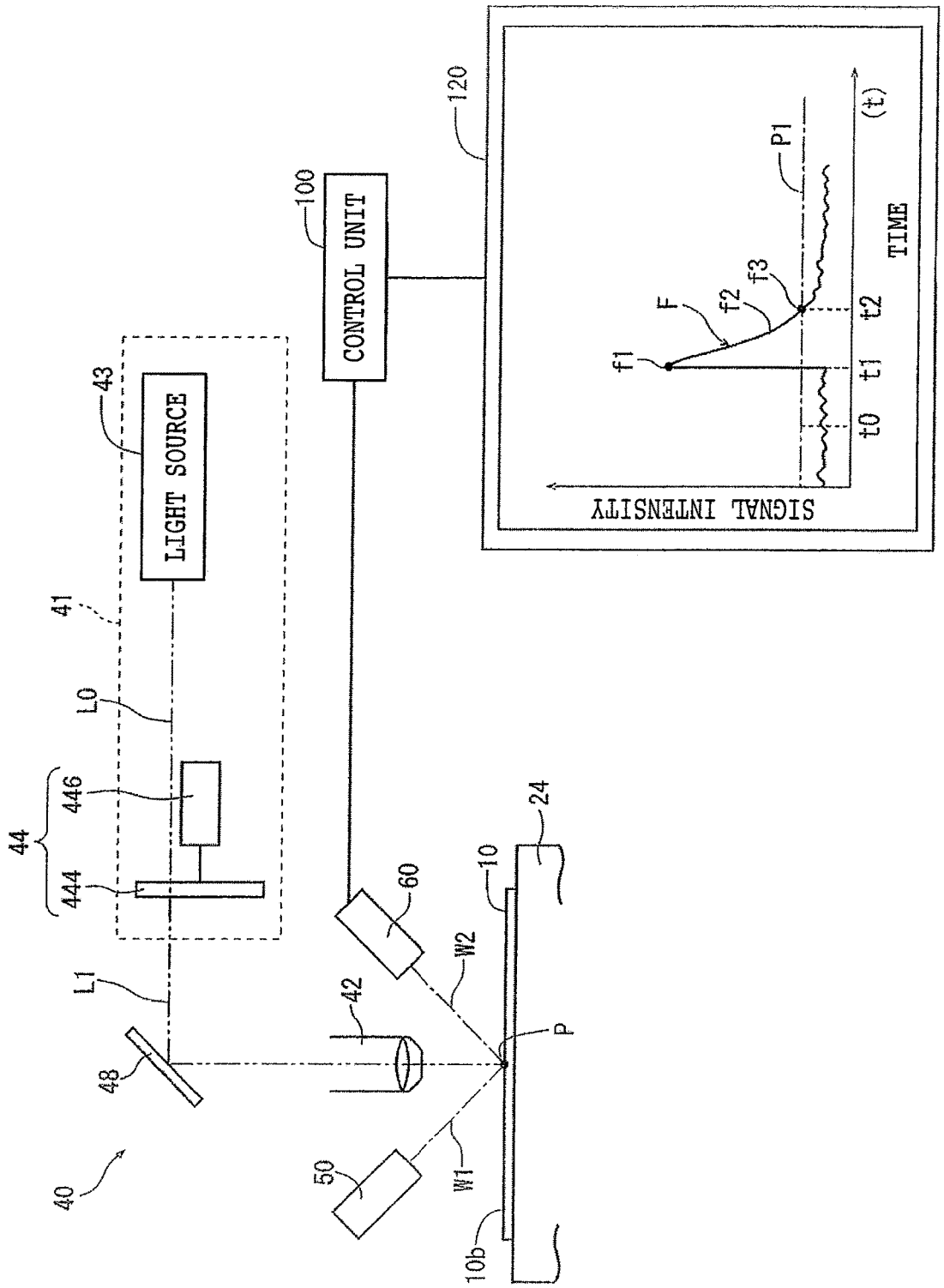
FIG. 3 is a block diagram depicting an optical system, a laser beam irradiation unit, microwave irradiation means and microwave reception means in the testing system depicted in FIG. 1.

FIG. 3 is a block diagram depicting the optical system 40 with the laser beam irradiation unit 41 included therein. The optical system 40 includes, in addition to the laser beam irradiation unit 41, a reflection mirror 48 and the condenser 42. The reflection mirror 48 changes the optical path of a laser beam L1 of a desired wavelength, which has been emitted from the laser beam irradiation unit 41, toward the chuck table 24. The condenser 42 focuses the laser beam L1 which has been guided by the reflection mirror 48, and irradiates the focused laser beam L1 onto a predetermined irradiation position P on the semiconductor wafer 10 held on the chuck table 24. It is to be noted that the condenser 42 and the reflection mirror 48 may be appropriately disposed as needed. The laser beam irradiation unit 41 includes a light source 43 and a wavelength selection section 44. The wavelength selection section 44 selects a laser beam L1 of a desired wavelength from light L0 emitted from the light source 43, and irradiates the selected laser beam L1.

Figure 4:
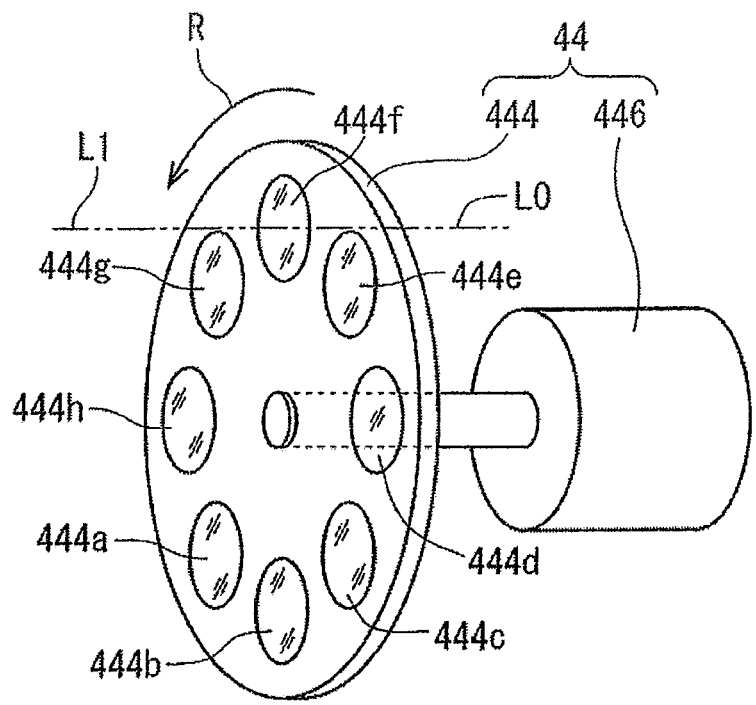
FIG. 4 is a perspective view depicting a specific configuration of a wavelength selection section in the laser beam irradiation unit depicted in FIG. 3.

As the light source 43 that emits the light L0, a white light source can be adopted, for example. The light L0 (hereinafter called "the white light L0") emitted from the white light source may preferably be light that contains a wide range of wavelengths (for example, in a range of 300 to 1000 nm) including visible light. The white light source, which emits the white light L0, can be selected from the group consisting of a super luminescent diode (SLD) light source, an amplified spontaneous emission (ASE) light source, a supercontinuum (SC) light source, a light emitting diode (LED) light source, a halogen light source, a xenon light source, a mercury light source, and a metal halide light source. A specific configuration example of the wavelength selection section 44 is depicted in FIG. 4. The wavelength selection section 44 depicted in FIG. 4 includes a bandpass filter plate 444 and a pulse motor 446. The bandpass filter plate 444 has a disk shape, and in an outer circumferential region thereof, includes a plurality of kinds of bandpass filters 444a to 444h that selectively extract and irradiate light of predetermined wavelengths, from the white light L0 emitted from the light source 43.

The bandpass filters 444a to 444h are optical filters, each of which selectively allows light of a predetermined different wavelength to pass for irradiation as the laser beam L1. For example, the bandpass filter 444a has a function to allow light of 300 nm wavelength to pass, the bandpass filter 444b has a function to allow light of 400 nm wavelength to pass, the bandpass filter 444c has a function to allow light of 500 nm wavelength to pass, the bandpass filter 444d has a function to allow light of 600 nm wavelength to pass, the bandpass filter 444e has a function to allow light of 700 nm wavelength to pass, the bandpass filter 444f has a function to allow light of 800 nm wavelength to pass, the bandpass filter 444g has a function to allow light of 900 nm wavelength to pass, and the bandpass filter 444h has a function to allow light of 1000 nm wavelength to pass. Driving of the pulse motor 446 by the control unit 100 causes the bandpass filter plate 444 to rotate in a direction indicated by arrow R, whereby a desired one of the bandpass filters 444a to 444h can be positioned at a passing position of the white light L0, and light of the corresponding wavelength can be selectively extracted from the white light L0 to generate the laser beam L1. The above-described embodiment is configured to include the eight bandpass filters. However, the present invention is not limited to such a configuration, and may be configured to include bandpass filters of necessary kinds as many as desired.

In the horizontal wall portion 4 of the frame 4, the microwave irradiation means 50 and the microwave reception means 60 are disposed. As depicted in FIG. 3, microwaves W1 irradiated from the microwave irradiation means 50 are irradiated at a predetermined incident angle to the back side 10b of the semiconductor wafer 10. The irradiation position of the microwaves W1 is set at the predetermined irradiation position P where the laser beam L1 is to be irradiated. Microwaves W2 irradiated to the predetermined irradiation position P are reflected at a reflection angle equal to the incident angle, and are received by the microwave reception means 60. The laser beam L1 is irradiated onto the predetermined irradiation position P on the semiconductor wafer 10 as described above, so that carriers (photoelectron-hole pairs) are generated through photoexcitation at the irradiation position P of the semiconductor wafer 10. The carriers change the conductivity of the semiconductor. The carriers so generated recombine with time, and become extinct after a carrier lifetime determined by a physical characteristic of the semiconductor wafer 10. Because the reflectivity for microwaves at the irradiation position P of the semiconductor wafer 10 changes according to the density of generated carriers, the reflectivity progressively decreases as the generated carriers recombine with time. The carrier lifetime can therefore be measured based on a change in microwaves received by the microwave reception means 60. It is hence possible to test the physical characteristic of the strained layer at the irradiation position P where the laser beam L1 is irradiated onto the back side 10b of the semiconductor wafer 10.

The control unit 100 includes a central processing unit (CPU), a read only memory (ROM), a random access memory (RAM), an input interface, and an output interface (depiction of their details is omitted in the figure). The CPU is configured of a computer, and performs arithmetic processing according to a control program. The ROM stores the control program and the like. The readable and writable RAM temporarily stores detection values, processing results, and the like. This control unit 100 functions as a control unit that controls individual operating parts of the testing system 1, and also stores control programs that perform irradiation of microwaves from the microwave irradiation means 50 and an analysis of the signal intensity waveform of microwaves received by the microwave reception means 60. As depicted in FIG. 3, changes with time of a signal intensity waveform F of microwaves received by the microwave reception means 60 are displayed on a display monitor 120 connected to the control unit 100.

The testing system 1 of this embodiment has the configuration as generally described above. Now, a description will hereinafter be made about operation of the testing system 1. Upon starting a test in this embodiment, the semiconductor wafer 10 is mounted on the chuck table 24 with the side of the back side 10b thereof directed upward as illustrated in FIG. 2. The moving mechanism 30 is then operated to move the chuck table 24 so that the semiconductor wafer 10 is positioned at a desired position right underneath the condenser 42.

After the semiconductor wafer 10 has been positioned right underneath the condenser 42, the microwave irradiation means 50 and microwave reception means 60 are operated to start irradiating the predetermined microwaves W1 toward the irradiation position P on the back side 10b as depicted in FIG. 3. As presented on the display monitor 120 in FIG. 3, at time t0, the laser beam L1 is not irradiated and no carriers are generated at the irradiation position P. The reflectivity for microwaves at the irradiation position P is hence in an extremely low state, so that microwaves are scarcely received or are received at an extremely low signal intensity by the microwave reception means 60.

The light source 43 disposed in the laser beam irradiation unit 41 and configured of the white light source is then operated to generate the white light L0. In this embodiment, in order to irradiate the laser beam L1 of 800 nm wavelength that is suited for the detection of the physical characteristic of the strained layer formed on the back side 10b of the semiconductor wafer 10, the wavelength selection section 44 has been operated beforehand to position the bandpass filter 444f, which allows the transmission of the light of 800 nm wavelength, on the optical path of the white light L0. The white light L0 passes through the bandpass filter 444f, whereby the light of 800 nm wavelength is selected and the laser beam L1 of 800 nm wavelength is irradiated from the laser beam irradiation unit 41.

When the laser beam L1 is irradiated from the laser beam irradiation unit 41 toward the irradiation position P, carriers (photoelectron-hole pairs) are generated through photoexcitation according to the physical characteristic of the strained layer on the back side 10b of the semiconductor wafer 10, leading to a change in the conductivity of the strained layer at the irradiation position P. As presented on the display monitor 120 in FIG. 3, when carriers are generated at the timing (time t1) of irradiation of the laser beam L1 toward the irradiation position P of the semiconductor wafer 10, the reflectivity for microwaves at the irradiation position P exponentially increases, and the signal intensity waveform F of the microwaves W2 received by the microwave reception means 60 also exponentially increases to a peak f1 as presented on the display monitor 120 in FIG. 3. After the signal intensity of the microwaves W2 received by the microwave reception means 60 has reached the peak f1 at time t1, the carriers generated through photoexcitation recombine with time, so that the reflectivity for microwaves at the irradiation position P gradually decreases. Along with this gradual decrease, the signal intensity waveform F presented on the display monitor 120 in FIG. 3 also gradually decreases in a range indicated by f2.

Now, a threshold P1 has been set beforehand in the control unit 100 to determine the timing of extinction of the carriers from the change in the signal intensity of the microwaves W2 received by the microwave reception means 60. The threshold P1 is set at a value slightly greater than the signal intensity of the microwaves W2 received by the microwave reception means 60, for example, before the laser beam L1 is irradiated toward the irradiation position P. If the signal intensity waveform F gradually decreases and time t2 of a point f3, at which the signal intensity waveform F is lower than the threshold P1, is detected, the carriers generated at the irradiation position P are regarded to have become fully extinct, and the lifetime of the carriers generated by the irradiation of the laser beam L1 is detected as (t2-t1). This carrier lifetime (t2-t1) is stored in the control unit 100, and is provided for the analysis of the physical characteristic of the strained layer formed on the back side 10b of the semiconductor wafer 10.

If the material of the semiconductor wafer 10 or the impurity or the like contained in the strained layer is different, it may be more appropriate to set the wavelength of the laser beam L1 for the induction of photoexcitation at another wavelength, for example, 300 nm instead of 800 nm. In such a case, the bandpass filter plate 444 is rotated in the direction indicated by arrow R to position the bandpass filter 444a on the optical path of the white light L0. By appropriately operating the wavelength selection section 44 as described above, the selection of the wavelength of the laser beam L1 can be easily realized, and therefore an appropriate test can be practiced in line with the material of the semiconductor wafer 10 and the kind of an impurity (heavy metal or the like) layer in the semiconductor wafer 10.

Figure 5:
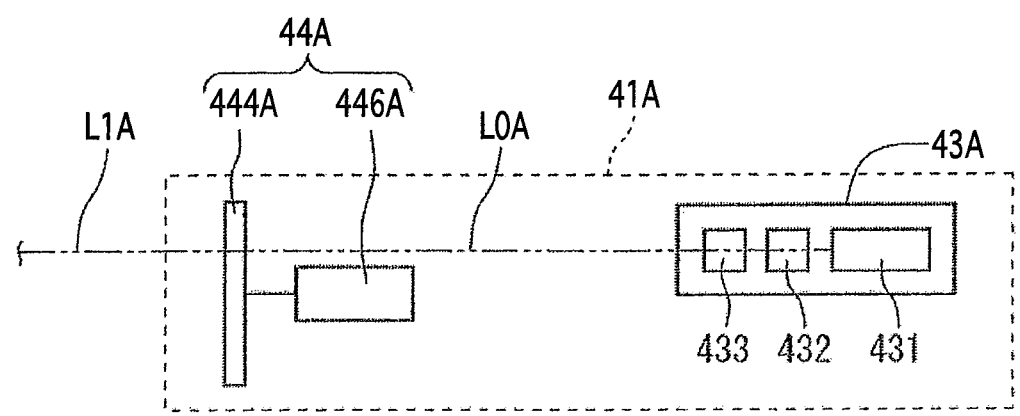
FIG. 5 is a block diagram depicting a modification of the laser beam irradiation unit.

According to the present invention, a variety of modifications is also provided without being limited to the above-described embodiment. In the above-described embodiment, the white light source is adopted as the light source 43 of the laser beam irradiation unit 41, for example. The present invention is not limited to the adoption of such a white light source, but as depicted in FIG. 5, can also adopt a light source 43A including variable-wavelength laser generation means as depicted in FIG. 5. As also depicted in FIG. 5, the light source 43A of the laser beam irradiation unit 41A is configured of a laser oscillator 431 that emits a laser beam of, for example, 1064 nm wavelength, a KTP crystal 432 that is a nonlinear crystal, and a CLBO crystal 433 that is a nonlinear crystal. By transmission through the KTP crystal 432, the laser beam of 1064 nm wavelength emitted from the laser oscillator 431 is converted, in part, to a laser beam of 532 nm wavelength. By further transmission through the CLBO crystal 433, the laser beam of 532 nm wavelength is converted, in part, to a laser beam of 266 nm wavelength.

Described specifically, the light source 43A converts the laser beam of 1064 nm wavelength emitted from the laser oscillator 431, and generates a laser beam L0A which includes the laser beam of 1064 nm wavelength, the laser beam of 532 nm wavelength, and the laser beam of 266 nm wavelength. In the laser beam irradiation unit 41, a waveform selection section 44A is disposed to select laser beams of desired wavelengths from the laser beam L0A. Although details are omitted herein, the waveform selection section 44A has substantially the same configuration as the wavelength selection section 44 depicted in FIG. 4, and is required to include a bandpass filter plate 444A having, in place of the bandpass filters 444a to 444h disposed in the wavelength selection section 44, a bandpass filter that allows the laser beam of 1064 nm wavelength, a bandpass filter that allows the laser beam of 532 nm wavelength, and a bandpass filter that allows the laser beam of 266 nm wavelength.

Operation of a pulse motor 446A causes rotation of the bandpass filter plate 444A, whereby a laser beam L1A of a desired one of the above-described wavelengths can be selected and irradiated. The configuration of the variable-wavelength laser generation means is not limited to the above-described example. For example, the wavelength of the laser beam to be emitted from the laser oscillator 431 is not limited to 1064 nm, and a laser oscillator that oscillates a laser of another wavelength may also be used. Further, the nonlinear crystals, which are used to convert wavelengths, are not limited to the above-described combination of the KTP crystal and the CLBO crystal, and may be a combination of nonlinear crystals of the same kind or a combination of nonlinear crystals of different kinds, for example, a combination including a nonlinear crystal of another nonlinear crystal, e.g., an LBO crystal, a KDP crystal, or the like, so that laser beams of various wavelengths can be generated.

In the above-described embodiment, the microwave irradiation means 50 is positioned to irradiate microwaves W1 at the predetermined indent angle toward the irradiation position P, and the microwave reception means 60 is disposed at the position where the microwaves reflected at the reflection angle corresponding to the incident angle are received. However, the present invention is not limited to such a configuration. Using a waveguide, for example, microwaves irradiated from a microwave oscillator, which functions as microwave irradiation means, can be transmitted and irradiated vertically from above to a semiconductor wafer at a predetermined irradiation position. Microwaves reflected at the irradiation position are again guided to the waveguide and transmitted. Then, the reflected microwaves can be divided by a junction waveguide (for example, a magic T) disposed at an intermediate position in the waveguide, and can be guided to and received by microwave reception means arranged at a position after the division. By further configured to guide a laser beam, which is irradiated from a laser beam irradiation unit, from a through-hole formed at an appropriate position of the waveguide, the laser beam can be irradiated onto the irradiation position of the semiconductor wafer vertically from above like the microwaves irradiated from the microwave oscillator (reference should also be made to JP 2005-142359A, the disclosure of which is incorporated herein by reference).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A testing system for testing a workpiece for a characteristic, the testing system comprising:
   a chuck table that holds the workpiece;
   microwave generator that generates and transmits microwaves to the workpiece held on the chuck table;
   microwave receiver that receives microwaves reflected from the workpiece; and
   a laser beam irradiation unit that irradiates a laser beam onto the workpiece at an irradiation position thereof where the microwaves have been irradiated,
   wherein the laser beam irradiation unit includes a wavelength selection section capable of selecting a wavelength for the laser beam to be irradiated, and
   the workpiece is tested for the characteristic by irradiating the microwaves from the microwave generator to the workpiece and also irradiating the laser beam from the laser beam irradiation unit onto the workpiece at the irradiation position, receiving, by the microwave receiver, microwaves reflected at the irradiation position where the workpiece has a reflectivity increased by carriers generated through photoexcitation, and measuring a lifetime of the carriers.

2. The testing system according to claim 1, wherein the laser beam irradiation unit includes a white light source as a light source and a plurality of kinds of bandpass filters as the wavelength selection section, and the bandpass filters are configured to selectively extract and irradiate light of a plurality of wavelengths out of light from the white light source.

3. The testing system according to claim 2, wherein the white light source is selected from a group consisting of a super luminescent diode light source, an amplified spontaneous emission light source, a supercontinuum light source, a light emitting diode light source, a halogen light source, a xenon light source, a mercury light source, and a metal halide light source.

4. The testing system according to claim 1, wherein the laser beam irradiation unit includes variable-wavelength laser generation means.

5. The testing system according to claim 1, further comprising a bandpass filter plate including the bandpass filters and a pulse motor connected to the bandpass filter plate that rotates the bandpass filter plate.

* * * * *